US006818359B2

(12) United States Patent
Burgess et al.

(10) Patent No.: US 6,818,359 B2
(45) Date of Patent: Nov. 16, 2004

(54) RETICLES AND METHODS OF FORMING AND USING THE SAME

(75) Inventors: Byron N. Burgess, Boise, ID (US); William A. Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 10/230,946

(22) Filed: Aug. 29, 2002

(65) Prior Publication Data

US 2004/0043304 A1 Mar. 4, 2004

(51) Int. Cl.$^7$ .............................. G03F 9/00; G03C 5/00
(52) U.S. Cl. ........................................... 430/5; 430/311
(58) Field of Search ........................... 430/5, 311, 313; 716/19

(56) References Cited

U.S. PATENT DOCUMENTS 5,429,896 A    7/1995   Hasegawa et al.
5,429,897 A    7/1995   Yoshioka et al.
5,446,521 A    8/1995   Hainsey et al.
5,707,765 A    1/1998   Chen
5,786,114 A    7/1998   Hashimoto
5,821,014 A   10/1998   Chen et al.
5,881,125 A    3/1999   Dao
6,255,024 B1   7/2001   Pierrat
6,451,488 B1 * 9/2002   Rhodes .......................... 430/5
2001/0005619 A1 6/2001  Hasebe er al.

* cited by examiner

Primary Examiner—S. Rosasco
(74) Attorney, Agent, or Firm—Dinsmore & Shohl LLP

(57) ABSTRACT

Reticles having reticle patterns suitable for reducing edge of array effects are provided. The reticle patterns may have transmission patterns etched in the periphery areas of the reticle patterns. Systems incorporating the reticles are also provided. Additionally, methods of forming and using the reticles are provided.

32 Claims, 3 Drawing Sheets

RETICLES AND METHODS OF FORMING AND USING THE SAME

BACKGROUND OF THE INVENTION

The present invention is directed toward reticles and methods of forming and employing the reticles.

Reticles are used in the semiconductor industry to form semiconductor devices having device features. There is a continuing effort to increase device density by scaling down device size, and state of the art devices currently have device features with dimensions well below one micron. Most reticles contain subarray areas containing the patterns for the memory features of the device. As the features size decreases, edge of array effects are observed. The edge of array effects are generally seen as critical dimension differences between the edge or corner of the subarray area and the subarray area a distance from the edge.

The edge of array effects may be caused by a number of factors. For example, process loading during the manufacture of a reticle may occur. Process loading during reticle manufacture may introduce error into the subarray area because the entire reticle pattern may contain dense and less dense or open areas. Similarly, process loading during wafer processing may occur that causes error to be introduced into the subarray area on the wafer. Stray light from less dense areas of a reticle can cause bulk exposure in a clear field reticle. Additionally, reticles may suffer from underexposure due to large dark areas of a dark field reticle to prevent underexposure.

Thus, there remains a need in the art for reticle patterns that address edge of array effects, and there remains a need in the art for methods of forming and using such reticle patterns.

SUMMARY OF THE INVENTION

The present invention relates to reticles and methods of forming and using reticles. In accordance with one embodiment of the present invention, a reticle is provided. The reticle comprises a reticle substrate having a reticle pattern, and the reticle pattern comprises at least one subarray area and at least one periphery area. The at least one subarray area is defined by densely patterned subarray features, and the at least one periphery area is defined by open areas that lie outside the at least one subarray area. The open areas defining the at least one periphery area have a transmission pattern etched therein.

In accordance with another embodiment of the present invention, a system for patterning a radiation sensitive layer comprising a source of electromagnetic radiation and a reticle is provided. The reticle comprises a reticle substrate having a reticle pattern, and the reticle pattern comprises at least one subarray area and at least one periphery area. The at least one subarray area is defined by densely patterned subarray features, and the at least one periphery area is defined by open areas that lie outside the at least one subarray area. The open areas defining the at least one periphery area have a transmission pattern etched therein.

In accordance with yet another embodiment of the present invention, a method of forming a reticle is provided. The method comprises providing a reticle blank; patterning the reticle blank to form a reticle pattern, wherein the reticle pattern comprises at least one subarray area and at least one periphery area, the at least one subarray areas is defined by densely patterned subarray features, and the at least one periphery area is defined by open areas that lie outside the at least one subarray area; and etching said open areas defining said at least one periphery area to form a transmission pattern.

In accordance with another embodiment of the present invention, a method of patterning a radiation sensitive layer is provided. The method comprises providing a reticle, and the reticle comprises a transparent reticle substrate having a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a transmission pattern formed therein. The method further comprises exposing a radiation sensitive layer with the reticle such that the radiation sensitive layer is exposed the reticle pattern. The densely patterned subarray features defining the at least one subarray area are patterned on the radiation sensitive layer in areas exposed to the at least one subarray area, and the radiation sensitive layer is not patterned in areas exposed to the transmission pattern in the at least one periphery area.

DETAILED DESCRIPTION OF THE PREFERRED EMBODIMENTS

Figure 1:
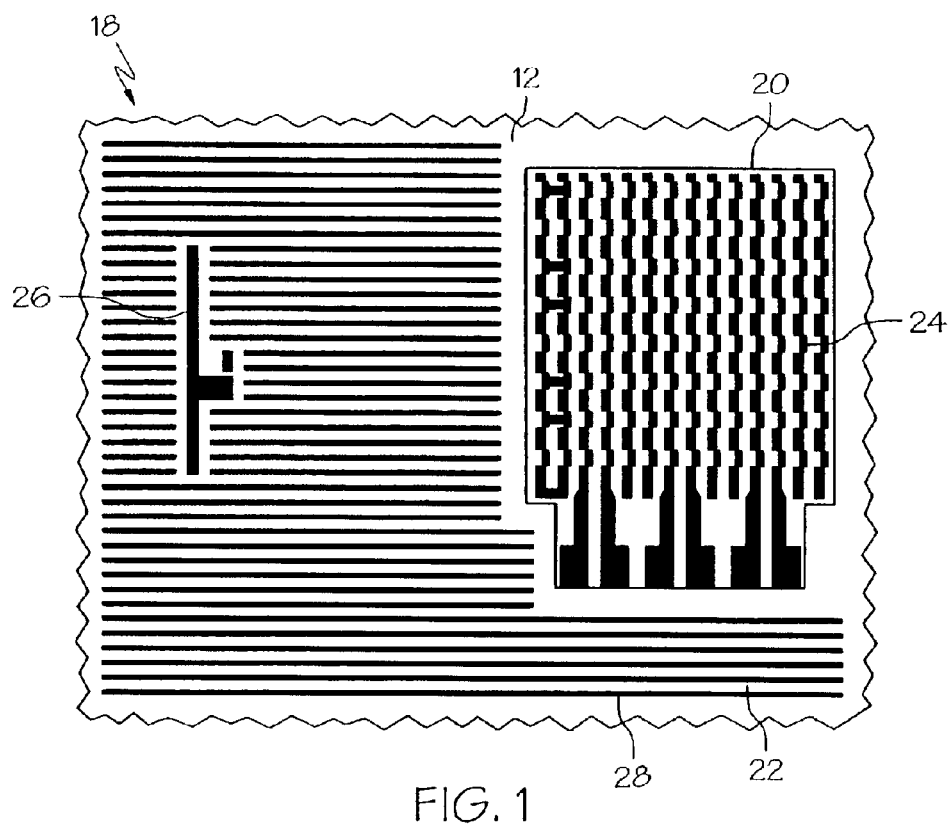
FIG. 1 is a schematic illustration of a portion of a reticle in accordance with the present invention.

The present invention provides reticles having reticle patterns that reduce edge of array effects and methods of forming and using the same.

In the following detailed description, reference is made to the accompanying drawings that form a part hereof, and in which is shown by way of illustration, and not by way of limitation, specific embodiments in which the invention may be practiced. It is to be understood that other embodiments may be utilized and that changes may be made without departing from the spirit and scope of the present invention. In the drawings, like numerals describe substantially similar components throughout the several views.

Referring to FIG. 1, a portion of a reticle 18 is illustrated schematically. The reticle 18 may be used to form patterns on radiation sensitive layers when the reticle is exposed to patterning radiation. The reticle 18 generally comprises a transparent reticle substrate 12 having a reticle pattern. The reticle pattern comprises at least one subarray area 20 and at least one periphery area 22. It will be understood by those having skill in the art that the reticle pattern generally has a plurality of subarray areas 20 and periphery areas 22 in a desired configuration. The subarray area 20 is defined by densely patterned subarray features 24. The densely patterned subarray features 24 are generally patterns for subarray components that are formed in a tightly packed configuration in the subarray area 20. For example, the densely patterned subarray features 24 may have a space to feature ratio of about 1:1 to about 4:1. The densely patterned subarray features 24 may be feature patterns for capacitors or transistors or other suitable feature patterns that generally form portions of a memory array.

The periphery area 22 is defined by open areas that lie outside the subarray area 20, and the open areas generally begin adjacent to the subarray area 20. The periphery area is defined by open areas because there are no densely patterned subarray features 24 in the open areas and because the open areas generally do not contain other densely patterned feature patterns formed near the subarray area 20. However, the open areas defining the periphery area 22 may have feature patterns 26 formed in the open areas. The feature patterns 26 formed in the periphery area 22 are generally separated from the densely patterned subarray features 24. The feature patterns 26 may include, but are not limited to, feature patterns for sense amplifiers, row decoders, and row drivers.

The open areas defining the periphery area 22 may contain a transmission pattern 28 etched therein. The presence of the transmission pattern 28 on the reticle 18 may address edge of array effects that may occur in reticle patterns having densely patterned subarray areas and less densely patterned periphery areas. For example, the difference between the critical dimension of subarray features 24 patterned on a radiation sensitive layer near the center of the at least one subarray area 20 and the critical dimension of subarray features 24 patterned on a radiation sensitive layer near the edge of the at least one subarray area 20 is addressed by the presence of the transmission pattern 28. For example, the presence of the transmission pattern 28 may address the amount of stray light that can cause bulk exposure from less dense areas. Mid-range flare of stepper tools may be addressed by the presence of the transmission pattern 28 on the reticle 18.

Figure 2:
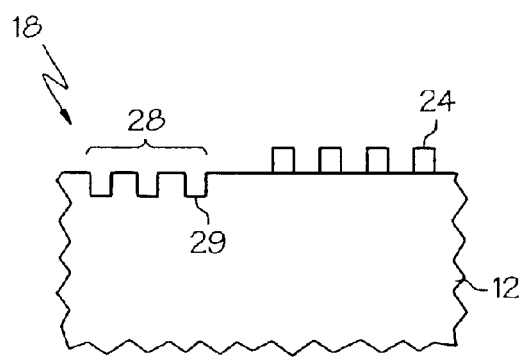
FIG. 2 is a cross-section of a portion of a reticle in accordance with the present invention.

Referring to FIGS. 1 and 2, the transmission pattern 28 is etched into the reticle substrate 12 in the open areas defining the periphery area 22. The transmission pattern is generally formed about 4 to about 40 $\mu$m from the subarray area 20, and the transmission pattern is more typically formed about 4 $\mu$m from the subarray area. The transmission pattern 28 may be a line pattern as shown in FIG. 1. The line pattern 28 is generally formed by etching a series of trenches 29 in the reticle substrate 12. The trenches 29 are generally etched to a have a depth between about $\lambda/(4(n-1))$ to about $\lambda/(6(n-1))$ where $\lambda$ is the wavelength of a given patterning radiation in angstroms and n is the index of refraction of the reticle substrate 12. The depth of the trenches 29 is generally chosen to provide a desired phase shift of patterning radiation that passes through the transmission pattern. The patterning radiation is generally phase shifted less than about 180° upon passing through the transmission pattern 28, and the patterning radiation is more generally phase shifted about 60° to about 120°. Controlling the phase shift of the patterning radiation allows the intensity of the patterning radiation at the imaging point, such as a radiation sensitive layer, to be effectively reduced after passing through the transmission pattern due to destructive interference. For the purposes of defining and describing the present invention it is noted that an imaging point is defined by a point, line, or plane at which an image of a subject pattern may be formed. For example, the imaging point may correspond to the focal point or focal plane of a given imaging system. The imaging point may also correspond to some point, line or plane displaced from the focal point or focal plane of a given imaging system, as long as a useful image of the subject pattern is formed at the displaced point or plane.

Figure 3:
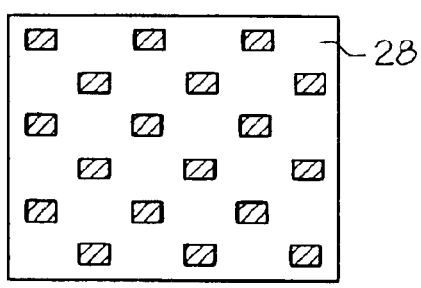
FIG. 3 is a schematic illustration of one transmission pattern in accordance with the present invention.

The trenches 29 may be formed to have a space to line ratio of between about 1:1 to about 4:1. The space to line ratio is chosen in conjunction with the trench 29 depth to provide a desired intensity of patterning radiation at the imaging point for given optical settings. The transmission pattern 28 may also be an alternating box pattern as shown in FIG. 3 or any other suitable pattern. If the transmission pattern 28 comprises another suitable pattern, the pattern parameters are chosen to provide a desired intensity of patterning radiation at the imaging point.

The trasmission pattern is generally formed such that the intensity of the patterning radiation incident on a given imaging point is less than the intensity of patterning radiation incident on the transmission pattern 28 due to destructive interference caused by the patterning radiation being phase shifted after passing through the transmission pattern 28. The transmission pattern 28 may be formed such that the intensity of patterning radiation at a given imaging point after being transmitted through the transmission pattern 28 is approximately equal to the intensity of patterning radiation at a given imaging point after being transmitted through the subarray area 20. This will reduce the amount of stray light from the periphery area 22 because the background radiation is reduced. For example, the transmission pattern 28 may be formed such that about intensity of the patterning radiation at the imaging point is about 25 to 50% of the intensity of the patterning radiation incident on the transmission pattern 28, and the transmission pattern 28 is more typically formed such that the intensity of the patterning radiation at the imaging point is about 35% of the intensity of patterning radiation incident on the transmission pattern 28.

Referring to FIGS. 1 and 2, the transmission pattern 28 is generally etched such that the transmission pattern 28 comprises a non-printable pattern. As used herein, the term "non-printable pattern" is defined to mean a pattern that will not cause a radiation sensitive layer to be printed upon exposing the non-printable pattern to patterning radiation. Generally, the depth and space to line ratio of the transmission pattern 28 is chosen to provide a phase shift that will cause destructive interference and ensure that the transmission pattern 28 is non-printable for a given set of optical settings. For example, the trenches 29 of the transmission pattern 28 may be formed a distance apart that is at or near the wavelength of the patterning radiation to which the reticle 18 is exposed. Alternatively, the trenches 29 of the transmission pattern 28 may be formed a distance apart that is below the wavelength the patterning radiation to which the reticle 18 is exposed. For example when the transmission pattern 28 comprises a series of alternating trenches 29, the transmission pattern 28 creates an alternating phase filter wherein patterning radiation is phase shifted less than about 180° upon passing through the alternating phase filter. The phase shift causes destructive interference, and the transmission pattern does not print. Thus, the transmission pattern 28 is highly tunable and not limited to small pattern sizes.

Figure 4:
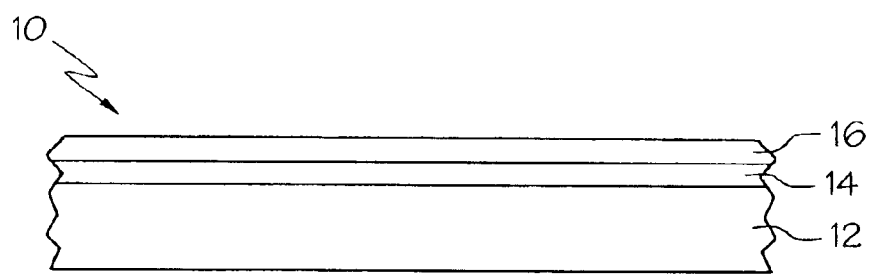
FIG. 4 is an illustration of a portion of a reticle blank.

FIG. 4 shows a portion of a reticle blank 10 that may be used in forming the reticles of the present invention. The reticle blank 10 has a transparent reticle substrate 12, a radiation blocking layer 14, and a resist layer 16. The transparent reticle substrate 12 may be formed from any suitable material such as quartz, and the transparent reticle substrate 12 may be of any suitable thickness and size. The radiation blocking layer 14 may be formed from one or more radiation blocking materials. For example, the radiation blocking layer 14 may be formed from chromium, molybdenum silicide, and combinations thereof. The resist layer 16 may be any suitable resist. It will be understood by those having skill in the art that other suitable reticle blanks and layer configurations may be used.

Referring to FIGS. 1 and 4, the reticle pattern comprising at least one subarray area 20 and at least one periphery area 22 may be formed using any suitable method. Generally, the desired reticle pattern is written onto the reticle blank 10. The reticle pattern may be written onto the reticle blank 10 using any suitable method. For example the reticle pattern may be written onto the reticle blank using an electron beam. Once the reticle pattern has been written on the reticle blank 18, the reticle blank 18 is developed and any exposed resist 16 is removed for a positive resist or any unexposed resist 16 is removed for a negative resist. The radiation blocking layer 14 is etched where the resist 16 has been removed, and the rest of the resist 16 is stripped. Generally, there will be no pattern formed in the open areas defining the periphery area 22 and the radiation blocking layer 14 will be removed in those areas.

Subsequently, the transmission pattern 28 is patterned onto another resist layer and the pattern is developed. The reticle substrate 12 is then etched to form the transmission pattern 28 on the reticle 18. For example, the reticle substrate 12 may be dry etched to form the transmission pattern. The remaining resist is then removed. Therefore, the densely patterned subarray features 24 defining the subarray area 20 and the features 26 in the periphery area 22 are formed from at least one radiation blocking layer 14 on a transparent reticle substrate 12. The transmission pattern 28 is formed from etching the reticle substrate 12 in areas that have been exposed.

Figure 5:
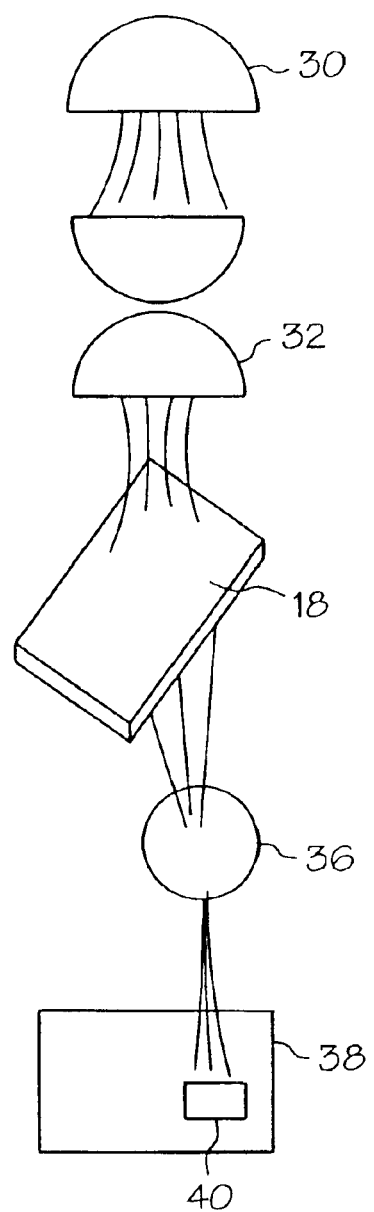
FIG. 5 is a schematic illustration of a reticle being used to pattern a radiation sensitive layer.

Referring to FIGS. 1 and 5, the reticle 18 having a transmission pattern 28 may be used to pattern at least a portion of a radiation sensitive layer 38. Generally, the reticle 18 is positioned over at least a portion of a radiation sensitive layer 38. The radiation sensitive layer 38 is exposed with the reticle 18, and a pattern 40 is formed on the radiation sensitive layer 38. The radiation sensitive layer 38 may be a part of a semiconductor substrate. As used herein, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. Generally, a radiation source 30 that produces patterning radiation is used to expose radiation sensitive layer 38 with the reticle 18, and the radiation source 30 may be an electromagnetic radiation source. The radiation source 30 may be an on or off axis radiation source, and the radiation source 30 is more generally an off axis radiation source.

The reticle 18 may be used in conjunction with a lithographic printer, and a condenser 32 and reduction lens 36 may be used during the exposure of the radiation sensitive layer 38 to focus and reduce the reticle pattern onto the radiation sensitive layer 38. The reticle 18 may be used in a step and repeat system, a step and scan system, or any other suitable system.

Upon exposing the radiation sensitive layer 38 with the reticle 18, the pattern 40 on the radiation sensitive layer 38 comprises the densely patterned subarray features 24 defining the subarray area 20 in areas exposed to the subarray area 20. The radiation sensitive layer 38 is not patterned in areas exposed to the transmission pattern 28 in the periphery area 22. However, pattern 40 further comprises patterns in areas of the radiation sensitive layer 38 exposed to the feature patterns 26 in the periphery area 22.

It will be obvious to those skilled in the art that various changes may be made without departing from the scope of the invention, which is not to be considered limited to what is described in the specification. It shall be observed that the present invention can be practiced in conjunction with a variety of integrated circuit fabrication and reticle fabrication techniques, including those techniques currently used in the art and any other suitable, yet to be developed techniques. Additionally, it is contemplated that the reticle designs disclosed herein are not limited to applications where edge of array effects are addressed.

What is claimed is:

1. A reticle comprising a transparent reticle substrate having a reticle pattern, wherein:
   said reticle pattern comprises at least one subarray area and at least one periphery area;
   said at least one subarray area is defined by densely patterned subarray features;
   said at least one periphery area is defined by open areas that lie outside said at least one subarray area;
   said at least one periphery area contains feature patterns selected from sense amplifiers, row decoders, row drivers and combinations thereof; and
   said open areas defining said at least one periphery area have a transmission pattern etched therein.

2. The reticle as claimed in claim 1 wherein said densely patterned subarray features are formed from at least one patterned radiation blocking layer.

3. The reticle as claimed in claim 1 wherein said open areas are adjacent to said at least one subarray area.

4. The reticle as claimed in claim 1 wherein said densely patterned subarray features comprise feature patterns including capacitors and transistors.

5. The reticle as claimed in claim 1 wherein said transmission pattern is selected from series of trenches etched in said open areas and boxes etched in said open areas and combinations thereof.

6. The reticle as claimed in claim 1 wherein said transmission pattern is etched such that said transmission pattern comprises a non-printable pattern.

7. The reticle as claimed in claim 1 wherein said transmission pattern is formed by a series of trenches etched in said transparent reticle substrate.

8. A reticle comprising a transparent reticle substrate having a reticle pattern, wherein:
   said reticle pattern comprises at least one subarray area and at least one periphery area;
   said at least one subarray area is defined by densely patterned subarray features;
   said at least one periphery area is defined by open areas that lie outside said at least one subarray area;
   said open areas defining said at least one periphery area have a transmission pattern etched therein; and
   said transmission pattern is formed about 4 to about 40 $\mu$m from said at least one subarray area.

9. The reticle as claimed in claim 8 wherein said transmission pattern is formed about 4 $\mu$m from said at least one subarray area.

10. A reticle comprising a transparent reticle substrate having a reticle pattern, wherein:
    said reticle pattern comprises at least one subarray area and at least one periphery area;
    said at least one subarray area is defined by densely patterned subarray features;
    said at least one periphery area is defined by open areas that lie outside said at least one subarray area;

said open areas defining said at least one periphery area have a transmission pattern etched therein;

said transmission pattern is formed by a series of trenches etched in said reticle substrate; and said trenches have a depth of between about $\lambda/(4(n-1))$ to about $\lambda/(6(n-1))$, wherein $\lambda$ is the wavelength of a given patterning radiation in angstroms and n is the index of refraction of said transparent reticle substrate.

11. The reticle as claimed in claim 10 wherein said series of trenches are etched approximately an equal distance apart.

12. The reticle as claimed in claim 10 wherein said series of trenches are formed such that the width of a single trench is approximately equal to the distance between said trenches.

13. The reticle as claimed in claim 10 wherein said trenches are etched such that the space to trench ratio is about 1:1 to about 4:1.

14. The reticle as claimed in claim 10 wherein said transmission pattern is formed such that patterning radiation that passes through said transmission pattern is phase shifted less than about 180°.

15. The reticle as claimed in claim 10 wherein patterning radiation is phase shifted about 60° to about 120° on passing through said transmission pattern.

16. A reticle comprising a transparent reticle substrate having a reticle pattern, wherein:

said reticle pattern comprises at least one subarray area and at least one periphery area;

said at least one subarray area is defined by densely patterned subarray features;

said at least one periphery area is defined by open areas that lie outside said least one subarray area;

said open areas defining said a least one periphery area have a transmission pattern etched therein; and said transmission pattern is etched such that the intensity of patterning radiation at a given imaging point after being transmitted through said transmission pattern is approximately equal to the intensity of patterning radiation at a given imaging point after being transmitted through said at least one subarray area.

17. A reticle comprising a transparent reticle substrate having a reticle pattern, wherein:

said reticle pattern comprises at least one subarray area and at least one periphery area;

said at least one subarray area is defined by densely patterned subarray features;

said at least one periphery area is defined by open areas that lie outside said least one subarray area;

said open areas defining said a least one periphery area have a transmission pattern etched therein; and said transmission pattern is etched such that the intensity of patterning radiation at a given imaging point after being transmitted through said transmission pattern is less than the intensity of patterning radiation incident on said transmission pattern.

18. The reticle as claimed in claim 17 wherein said intensity of said patterning radiation at a given imaging point after being transmitted through said transmission pattern is about 25 to about 50% of the intensity of said patterning radiation incident on said transmission pattern.

19. A system for patterning a radiation sensitive layer comprising a source of electromagnetic radiation and a reticle, wherein:

said reticle comprises a transparent reticle substrate having a reticle pattern;

said reticle pattern comprises at least one subarray area and at least one periphery area;

said at least one subarray area is defined by densely patterned subarray features formed on said transparent reticle substrate;

said at least one periphery area is defined by open areas that lie outside said at least one subarray area; and said open areas defining said at least one periphery area have a transmission pattern etched into said transparent reticle substrate.

20. A system for patterning a radiation sensitive layer comprising a lithographic printer and a reticle for use in said lithographic printer, wherein:

said reticle comprises a transparent reticle substrate having a reticle pattern;

said reticle pattern comprises at least one subarray area and at least one periphery area;

said at least one subarray area is defined by densely patterned subarray features;

said at least one periphery area is defined by open areas that lie outside said at least one subarray area;

said at least one periphery area contains feature patterns selected from amplifiers, row decoders, row drivers and combinations thereof; and said open areas defining said at least one periphery area contain a transmission pattern etched therein.

21. The system as claimed in claim 20 wherein said transmission pattern is etched such that the intensity of patterning radiation at a given imaging point after being transmitted through said transmission pattern is approximately equal to the intensity of patterning radiation at a given imaging point after being transmitted through said at least one subarray area.

22. The reticle as claimed in claim 20 wherein said transmission pattern is etched such that the intensity of patterning radiation at a given imaging point after being transmitted through said transmission pattern is less than the intensity of patterning radiation incident on said transmission pattern.

23. A method of forming a reticle, comprising:

providing a reticle blank;

patterning said reticle blank to form a reticle pattern, wherein:

said reticle pattern comprises at least one subarray area and at least one periphery area;

said at least one subarray areas is defined by densely patterned subarray features formed on said reticle blank; and said at least one periphery area is defined by open areas that lie outside said at least one subarray area; and etching said open areas defining said at least one periphery area to form a transmission pattern etched into said reticle blank.

24. The method of forming a reticle as claimed in claim 23 wherein said transmission pattern is formed about 4 to about 40 μm from said at least one subarray area.

25. A method of forming a reticle, comprising:

providing a reticle blank;

patterning said reticle blank to form a reticle pattern, wherein:

said reticle pattern comprises at least one subarray area and at least one periphery area;

said at least one subarray area is defined by densely patterned subarray features; and said at least one periphery area defined by open areas that lie outside said at least one subarray area; and etching said open areas defining said a least one periphery area to form a transmission pattern, wherein said transmission pattern is defined by a series of trenches etched in said reticle blank, wherein said trenches have a depth of between about $\lambda/(4(n-1))$ to about $\lambda/(6(n-1))$, and wherein $\lambda$ is the wavelength of a given patterning radiation in angstroms and n is the index of refraction of said transparent reticle substrate.

26. The method of forming a reticle as claimed in claim 25 wherein said series of trenches are etched approximately an equal distance apart.

27. The method of forming a reticle as claimed in claim 25 wherein said series of trenches are etched such that the width of a single trench is approximately equal to the distance between said trenches.

28. A method of forming a reticle, comprising:

providing a reticle blank;

patterning said reticle blank to form a reticle pattern, wherein:

said reticle pattern comprises at least one subarray area and at least one periphery area;

said at least one subarray area is defined by densely patterned subarray features; and said at least one periphery area is defined by open areas that lie outside said at least one subarray area; and etching said open areas defining said at least one periphery area to form a transmission pattern, wherein the intensity of patterning radiation at a given imaging point after being transmitted through said transmission pattern is less than the intensity of patterning radiation incident on said transmission pattern.

29. A method of forming a reticle, comprising:

providing a reticle blank;

patterning said reticle blank to form a reticle pattern, wherein:

said reticle pattern comprises at least one subarray area and at least one periphery area;

said at least one subarray area is defined by densely patterned subarray features; and said at least one periphery area is defined by open areas that lie outside said at least one subarray area; and etching said open areas defining said at least one periphery area to form a transmission pattern, wherein said transmission pattern is etched such that the intensity of patterning radiation at a given imaging point after being transmitted through said transmission pattern is approximately equal to the intensity of patterning radiation at a given imaging point after being transmitted through said at least one subarray area.

30. A method of patterning a radiation sensitive layer comprising:

providing a reticle, said reticle comprising a transparent reticle substrate having a reticle pattern, wherein:

said reticle pattern comprises at least one subarray area and at least one periphery area;

said at least one subarray area is defined by densely patterned subarray features formed on said transparent reticle substrate;

said at least one periphery area is defined by open areas that lie outside said at least one subarray area; and said open areas defining said at least one periphery area contain a transmission pattern etched into said transparent reticle substrate; and exposing a radiation sensitive layer with said reticle such that said radiation sensitive layer is exposed to said reticle pattern, wherein:

said densely patterned subarray features defining said at least one subarray area are patterned on said radiation sensitive layer in areas exposed to said at least one subarray area; and said radiation sensitive layer is not patterned in areas exposed to said transmission pattern in said at least one periphery area.

31. The method of patterning a radiation sensitive layer as claimed in claim 30 wherein the difference between the critical dimension of subarray features patterned on said radiation sensitive layer near the center of said at least one subarray area and the critical dimension of subarray features patterned on said radiation sensitive layer near the edge of said at least one subarray area is addressed by the presence of said transmission pattern.

32. A method of patterning a semiconductor substrate comprising:

providing a reticle, said reticle comprising a transparent reticle substrate having a reticle pattern, wherein:

said reticle pattern comprises at least one subarray area and at least one periphery area;

said at least one subarray area is defined by densely patterned subarray features;

said at least one periphery area is defined by open areas that lie outside said at least one subarray area;

said open areas defining said at least one periphery area contain a transmission pattern etched therein;

said at least one periphery area contains feature patterns selected from sense amplifiers, row decoders, row drivers and combinations thereof; and exposing at least a portion of a semiconductor substrate having a radiation sensitive layer with said reticle such that said radiation sensitive layer is exposed to said reticle pattern, wherein:

said densely patterned subarray features defining said at least one subarray area are patterned on said radiation sensitive layer in areas exposed to said at least one subarray area; and said radiation sensitive layer is not patterned in areas exposed to said transmission pattern in said at least one periphery area.

* * * * *

UNITED STATES PATENT AND TRADEMARK OFFICE
CERTIFICATE OF CORRECTION

PATENT NO. : 6,818,359 B2
DATED : November 16, 2004
INVENTOR(S) : Burgess et al.

It is certified that error appears in the above-identified patent and that said Letters Patent is hereby corrected as shown below:

Column 8,
Line 66, "$\lambda/(4(n-1)$ to about $\lambda/(6(n-1)$" should read -- $\lambda/(4(n-1))$ to about $\lambda/(6(n-1))$ --

Signed and Sealed this

Twenty-fourth Day of May, 2005

JON W. DUDAS
*Director of the United States Patent and Trademark Office*